United States Patent [19]

Mobley

[11] Patent Number: 4,661,712
[45] Date of Patent: Apr. 28, 1987

[54] APPARATUS FOR SCANNING A HIGH CURRENT ION BEAM WITH A CONSTANT ANGLE OF INCIDENCE

[75] Inventor: Richard M. Mobley, Ipswich, Mass.

[73] Assignee: Varian Associates, Inc., Palo Alto, Calif.

[21] Appl. No.: 737,840

[22] Filed: May 28, 1985

[51] Int. Cl.$^4$ .................... H01J 37/317; H01J 37/04
[52] U.S. Cl. .......................... 250/492.2; 250/398; 250/396 ML
[58] Field of Search ............... 250/492.2, 398, 396, 250/492.21, 396 ML

[56] References Cited

U.S. PATENT DOCUMENTS

| | | | |
|---|---|---|---|
| 3,319,110 | 5/1967 | Schlesinger | 315/17 |
| 3,585,397 | 6/1971 | Brewer | 250/49.5 |
| 3,676,693 | 7/1972 | Guernet | 250/49.5 C |
| 3,723,733 | 3/1973 | Seliger et al. | 250/49.5 T |
| 4,019,989 | 4/1977 | Hazewindus et al. | 250/396 ML |
| 4,101,813 | 7/1978 | Parker et al. | 315/370 |
| 4,117,339 | 9/1978 | Wolfe | 250/492 A |
| 4,283,631 | 8/1981 | Turner | 250/492 B |
| 4,287,419 | 9/1981 | Booth | 250/396 ML |
| 4,367,411 | 1/1983 | Hanley et al. | 250/492.2 |
| 4,449,051 | 5/1984 | Berkowitz | 250/492.2 |

OTHER PUBLICATIONS

Mobley et al, *IEEE Trans. Nucl. Sci.*, vol. NS-26, No. 3 (Jun. 1979) pp. 3112-3114.
Booth et al, *Nucl. Instrum. Methods*, vol. 151 (1978) pp. 143-147.
Thomson, *J. Vac. Sci. Technol.*, vol. 12, No. 6, (Nov./Dec. 1975), pp. 1156-1159.
Keller, *Radiation Effects*, vol. 44, (1979) pp. 71-80.
Keller et al, *Nucl. Instrum. Methods, vol. 139 (1976) pp. 41-45.*

*Primary Examiner*—Bruce C. Anderson
*Assistant Examiner*—Jack I. Berman
*Attorney, Agent, or Firm*—Stanley Z. Cole; William R. McClellan; Terrence E. Dooher

[57] ABSTRACT

Normal or constant angle scanning of a target with high current ion beam is provided by positioning a space charge lens between a beam deflection system and the target. The space charge lens is positioned such that its focal point coincides with the virtual center of deflection. The space charge lens steers the scanned beam into parallel paths so as to maintain a constant angle of incidence upon the workpiece. In an electrostatic deflection system, two sets of y-axis deflection plates can be axially positioned on opposite sides of the x-axis deflection plates to provide a single virtual center of deflection. The apparatus is useful for performing ion implantation with higly uniform dose distribution.

7 Claims, 3 Drawing Figures

APPARATUS FOR SCANNING A HIGH CURRENT ION BEAM WITH A CONSTANT ANGLE OF INCIDENCE

BACKGROUND OF THE INVENTION

This invention relates to the field of ion optics and, more particularly, to apparatus for scanning an ion beam over the surface of a workpiece while maintaining a substantially constant angle of incidence.

Ion implantation has become a standard technique for introducing impurity dopants into semiconductor wafers. A beam of ions is generated in a source and is directed with varying degrees of acceleration toward a target wafer. Ion implantation systems typically include an ion source, ion optics for removing undesired ion species and for focusing the beam, means for deflecting the ion beam over the target area, and an end station for mounting and exchanging wafers.

In most cases, the cross-sectional area of the ion beam is substantially smaller than the area of the target wafer. Therefore, relative motion between the wafer surface and the ion beam is necessary in order to distribute the implanted dose. If the target is moved in its own plane and the beam remains stationary, a situation typical of mechanically scanned systems, the angle of incidence of the beam clearly remains constant. In the more usual apparatus, the ion beam is scanned in one or two dimensions over the surface of the workpiece by magnetic or electrostatic deflecting fields. In such cases, the angle of incidence varies with beam deflection angle. As a result, the ion dose per unit area of the workpiece varies as the sine of the deflection angle.

The trend in semiconductor wafers has been toward larger diameters (up to 8 inches) to achieve economies of scale. As wafer dimensions increase, dose variations also increase due to the larger required deflection angle. Alternatively, the length of the scanning apparatus can be increased in order to maintain a constant angle of deflection. Neither alternative is acceptable, since dose uniformity requirements have become more stringent, while clean room floor space is at a premium. Dose variations due to scan angle can be compensated, as described in U.S. Pat. Nos. 4,283,631 and 4,449,051. However, it is more practical to maintain a constant angle of incidence without the necessity for compensation. Furthermore, the channeling effects described hereinafter cannot be easily compensated.

Variations in ion beam incidence angle present problems in connection with channeling effects. It is known that incident ions of a given energy penetrate into the crystal lattice of the target by different distances, depending on their angle of incidence with respect to various crystal planes. Thus, the variations in incident angle for a scanned ion beam result in different penetration depths and a corresponding variation in device characteristics over the surface area of the wafer. Such effects are difficult to compensate. It is customary in ion implantation to tilt a silicon wafer by a few degrees with respect to the incident ion beam to minimize channeling effects. Preferably, the angle should be maintained constant over the surface area of the wafer. Constant angular incidence has been achieved with electron beams using magnetic and electrostatic double deflection scanning, as shown in U.S. Pat. No. 4,101,813 and 4,117,339. Double deflection systems are practical in the case of electron beams due to the typically small electron currents and the small electron mass. One drawback of double deflection systems is that they require a careful synchronization of time-varying electrical inputs to the deflection elements.

Although double deflection systems can, in theory, be applied to ion beam systems, these systems have severe practical limitations. Ion implantation systems are required to work with beams in the range up to 100 milliamps and to implant high mass ions (such as arsenic). Such high current ion beams must be space charge neutralized by electrons traveling with the beam to avoid beam expansion, or blowup, due to charge repulsion. The use of electrostatic deflection elements with high beam currents results in the removal of the neutralizing electrons and an unacceptable beam expansion due to space charge repulsion. Magnetic elements do not remove electrons from the neutralized beam, but for high atomic mass ions, magnetic deflection elements are large, heavy and power consuming. A magnetic double deflection system for use in an ion implanter is disclosed in U.S. Pat. No. 4,367,411.

Ion beam lithography utilizes a finely focused ion beam which is deflected over the surface of a workpiece. Scanning with a constant angle of incidence is desirable in the case of ion beam lithography for the same reasons as set forth above in connection with ion implantation.

It is a general object of the present invention to provide novel ion beam scanning apparatus.

It is another object of the present invention to provide a high current ion implantation system with a constant angle of incidence between the ion beam and the workpiece.

It is still another object of the present invention to provide ion implantation apparatus wherein a space charge lens is utilized to achieve a constant angle of incidence between the ion beam and the workpiece.

SUMMARY OF THE INVENTION

According to the present invention, these and other objects and advantages are achieved in apparatus for charged particle beam treatment of a workpiece. The apparatus comprises means for forming a charged particle beam of predetermined parameters, means for positioning the workpiece generally in the path of the charged particle beam, and scanning means for deflecting the beam in at least one dimension over the surface of the workpiece. The apparatus, in accordance with the present invention, further includes space charge lens means interposed between the workpiece and the scanning means for steering the scanned beam to intercept the workpiece at constant angular incidence. The space charge lens means includes means for generating electrostatic and magnetic fields for confining an electron cloud having a generally uniform spatial distribution within a region traversed by the scanned beam. The virtual center of deflection of the scanning means is preferably coincident with a focal point of the space charge lens means.

BRIEF DESCRIPTION OF THE DRAWINGS

For better understanding of the present invention, together and other and further objects, advantages, and capabilities thereof, reference may be had to the accompanying drawings, which are incorporated herein by reference, and in which.

DETAILED DESCRIPTION OF THE INVENTION

Figure 1:
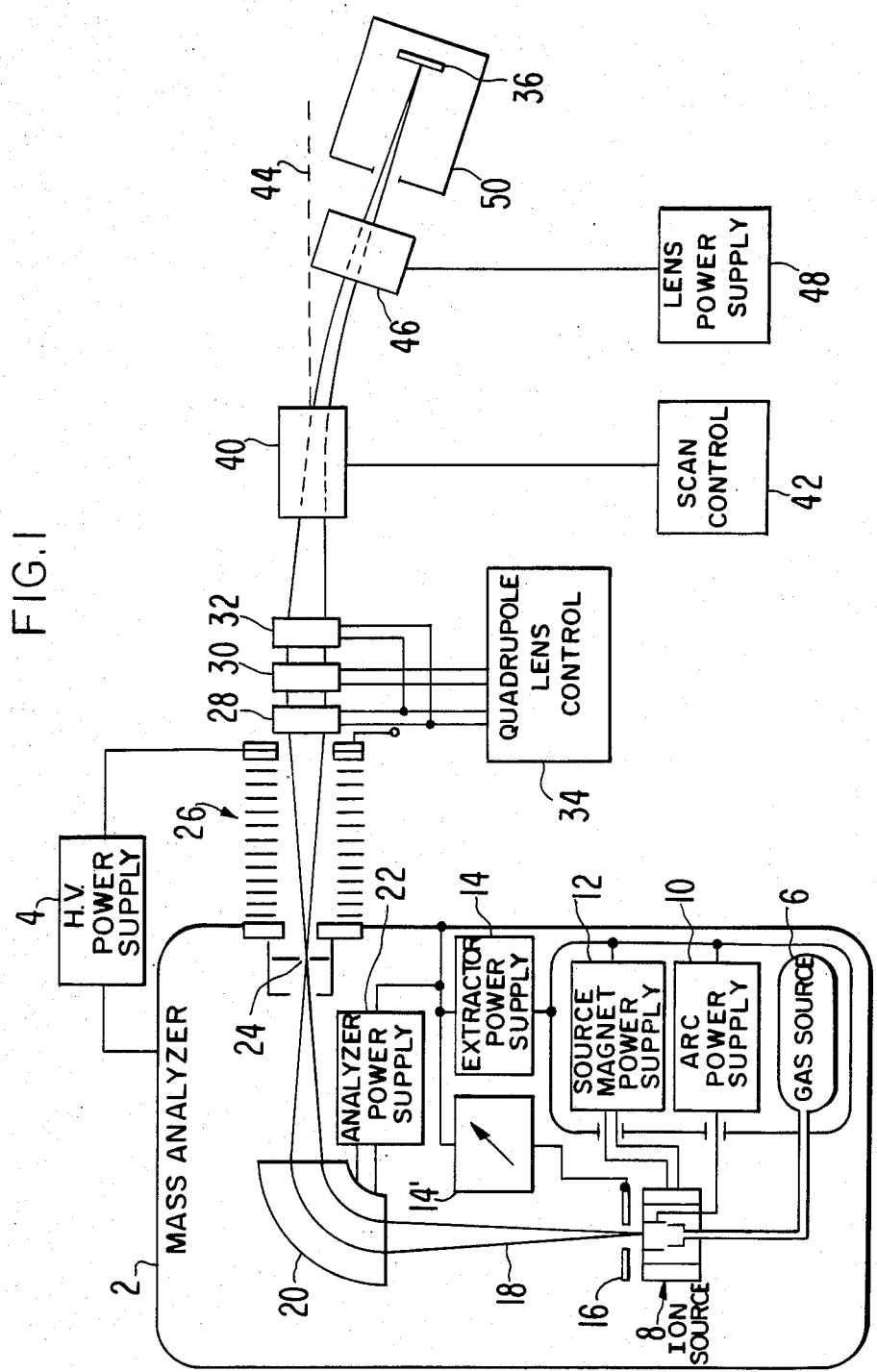
FIG. 1 is a schematic diagram of an ion implantation system suitable for utilization of the present invention.

An ion implantation system utilizing the present invention is shown in FIG. 1. A high voltage terminal 2 is held at high potential relative to ground by a high voltage power supply 4. The terminal 2 contains ion source apparatus required to form a beam of ions of a desired species. In common practice, an ion source 8 is provided to ionize a gas derived from a gas handling system 6 or to vaporize a solid material. A typical ion source requires a power supply 10 to sustain an ionizing discharge, a power supply 12 to impose an axial magnetic field across the discharge region, and an extraction supply 14 with vernier 14' to cooperate with an extraction electrode 16 to shape the electric field at the aperture of the ion source, thus achieving effective extraction of a well defined high current ion beam from the ion source. A variety of ion sources are known in art. See, for example, Aitken, "Ion Sources", *Ion Implantation Techniques*, SpringerVerlag, 1982.

An ion beam 18 diverging from the source 8 is momentum analyzed in an analyzer magnet 20, which is energized from an analyzer power supply 22. The analyzed beam passes through an analyzer exit slit 24 to an accelerator tube 26 where it encounters a carefully design field gradient from the high voltage terminal to ground potential. Optical elements, such as a quadrupole lens which may take the form of a quadrupole triplet 28, 30, 32, or other focusing elements, and an associated control system 34 operate to produce a spatial and energy focus at a target 36.

A deflection system 40, comprising x-axis and y-axis electrostatic deflection plates, scans the beam over the desired area of the target 36. The waveforms applied to the deflection plates and their synchronization to form the desired scanning program are generated by a scan control system 42. The beam 18 is deflected by a fixed angle from axis 44 sufficient to completely separate the beam from a neutral component arising principally from charge exchange collisions between residual gases and the charged beam. A space charge lens 46 is positioned along the path of the beam, between the deflection system 40 and the target 36. The space charge lens 46 is energized by a lens power supply 48. The operation of the deflection system 40 and the space charge lens 46 is described in detail hereinafter. A target chamber 50 contains beam defining apertures, beam monitoring and integrating apparatus, and equipment for introducing the workpiece, typically a semiconductor wafer, into the vacuum system, and positioning and cooling the wafer during ion implantation. The target 36 can be mounted by any convenient means but is typically clamped at its periphery to a platen which acts as a heat sink for energy received from the beam. It will be understood that the entire region traversed by the ion beam, between the source and the target, is maintained at high vacuum by a vacuum pumping apparatus (not shown).

In the fabrication of semiconductor integrated circuits, it is important to implant ions with highly uniform dose distribution over the surface area of the semiconductor wafer in order to obtain uniform and repeatable device characteristics. As noted hereinabove, scanned ion beam systems introduce nonuniformities due both to dose variations and to channeling effects. Therefore, scanning with constant angular incidence is desirable, but heretofore has been available in high current ion beam systems only where the target is mechanically scanned relative to a fixed ion beam or by the use of heavy, power-consuming magnetic elements.

Figure 2:
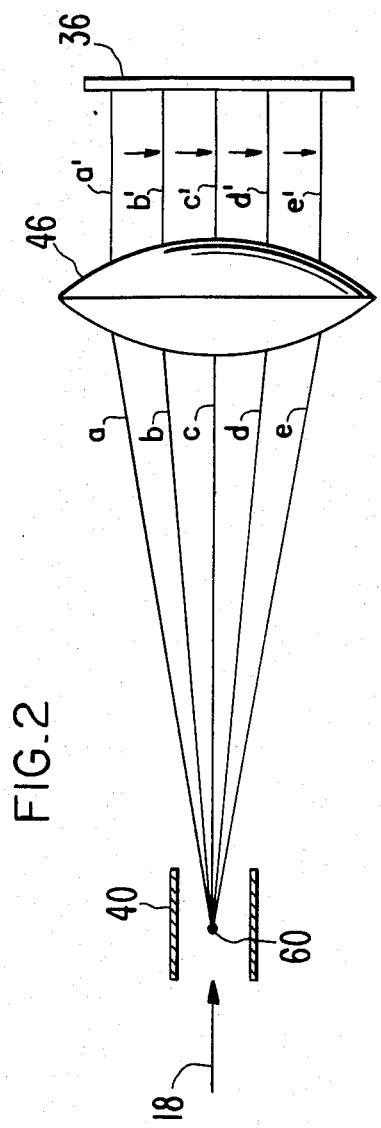
FIG. 2 illustrates the operation of the present invention in one dimension.

In accordance with the present invention, the space charge lens 46 is positioned between the deflection system 40 and the target 36 for steering the scanned beam into parallel paths, thereby achieving constant angular incidence on the target 36. A one dimensional embodiment of the invention is illustrated in FIG. 2. The deflection system 40 is positioned such that the virtual center of deflection is coincident with a focal point 60 of the lens 46. In the embodiment of FIG. 2, the deflection system 40 comprises a pair of electrostatic deflection plates. Upon application of a time-varying scan voltage to the deflection plates, the ion beam 18 passing through the plates is deflected successively to trajectories a, b, c, d and e. Since these beam trajectories originate at the focal point 60 of the lens 46, they are transformed by the lens to parallel trajectories, a', b', c', d', e'. The scanned ion beam, therefore, impinges on the target 36 with constant angular incidence. Although several trajectories are illustrated in FIG. 2, it will be understood that the beam follows only one trajectory at a particular instant of time. While normal scanning is illustrated in FIG. 2, it will be understood that the target 36 can be tilted by any prescribed angle with respect to the scanned ion beam, and the constant angular incidence is preserved. The space charge lens 46, in addition to steering the ion beam to parallel trajectories, advantageously preserves the space charge neutralization of a high current ion beam, and is relatively light weight and compact.

Figure 3:
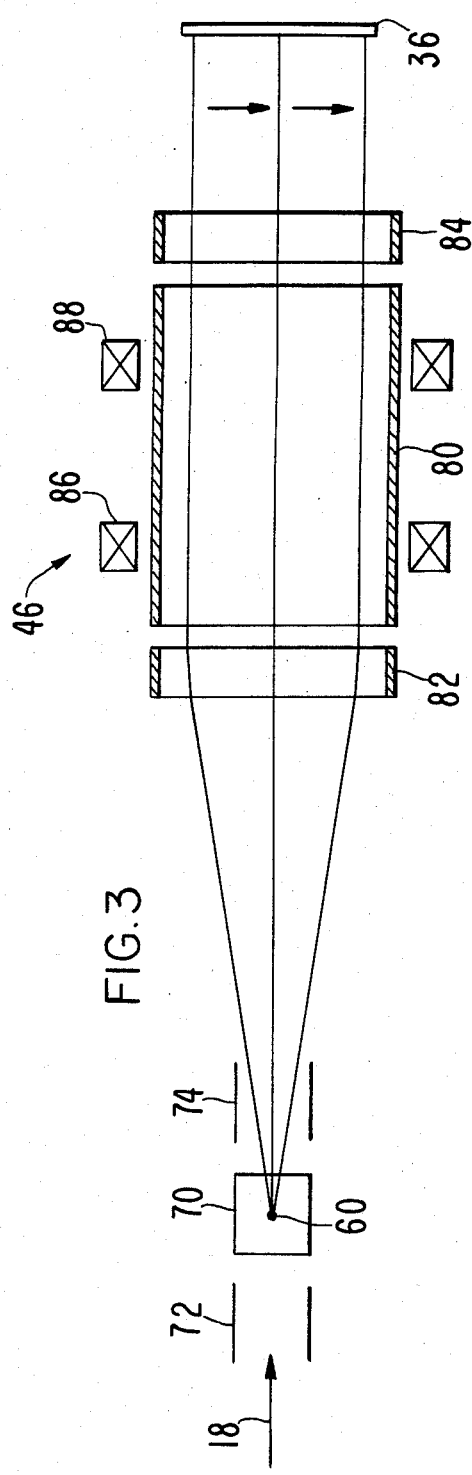
FIG. 3 illustrates apparatus for ion beam scanning in two dimensions with a constant angle of incidence.

The configuration of FIG. 2 can be extended to two dimensions by replacing the single-axis deflection plates with an xy deflection system. In practice, however, accurate two dimensional electrostatic, deflection is not obtainable from a small compact region. Typically, orthogonal x-axis and y-axis deflections are obtained in an ion implanter by separate sets of deflection plates spaced apart along the beam path. Such an arrangement is undesirable in the context of the present invention since each set of deflection plates has an associated virtual center of deflection. In utilizing the space charge lens to achieve constant angle scanning, it is necessary for the virtual center of deflection to coincide with the focal point of the space charge lens. An arrangement for two dimensional scanning is illustrated in FIG. 3. A first set of deflection plates 70 for deflecting the beam 18 along one axis (x) is positioned so that its virtual center of deflection coincides with the focal point 60 of the space charge lens 46. Scanning plates for deflection in the orthogonal direction (y) are positioned on opposite sides of the scanning plates 70. Thus, the y-axis deflection plates include an upstream deflection plate pair 72 and a downstream deflection plate pair 74. The y-axis deflection, which is accomplished in two steps by the plates 72, 74, can be shown to have a virtual center of deflection at the point 60.

The elements of the space charge lens 46 are illustrated in FIG. 3. The operation of a space charge lens, or Gabor lens, is generally known in the art and has been described by R. M. Mobley et al, *IEEE Trans, Nucl. Sci.*, Vol. NS-26, No. 3 (June 1979) pp. 3112-3114 and R. Booth et al, *Nucl. Instrum. Methods*, Vol. 151

(1978) pp. 143–147. In the case of two dimensional scanning, an axially symmetric space charge lens is required. Space charge lens employ electrostatic and magnetic fields to confine a cloud of electrons within a prescribed region. When the electrons are uniformly distributed in an axially symmetric region, a radial electric field exists in the electron cloud, the magnitude of which is proportional to the distance from the axis. As a result, the electron cloud exerts a force on moving charged particles which is proportional to radius and thereby acts as a lens.

With reference to FIG. 3, the space charge lens 46 includes a cylindrical center electrode 80, which is biased at approximately 1–10 kilovolts. Cylindrical electrodes 82, 84, positioned at opposite ends of, and axially aligned with, the center electrode 80 are grounded. Current carrying coils 86, 88 are positioned around the outside of the cylindrical electrode 80. Coils 86, 88 can be of the Helmholtz type which produce a generally uniform axial magnetic field within the cylindrical electrode 80. A magnetic field of 300 gauss is typically required. As a result of the crossed magnetic and electric fields within the electrode 80, a cloud of electrons is trapped therein, and is prevented from escaping by the grounded electrodes 82, 84. The electron cloud produces the radial electric field.

It will be understood that other electrode configurations can be utilized in the practice of the present invention, with the criteria being that electrostatic and magnetic fields are generated which confine a cloud of electrons within a prescribed area so as to produce a radial electric field which increases in magnitude with increasing radius. The diameter of the lens must be such as to steer the scanned beam without substantial aberrations. Furthermore, any desired deflection arrangement can be utilized with the criteria being that the virtual center of deflection of the scanning means is positioned to coincide with the focal point of the space charge lens. Scanning with constant angle of incidence is achieved for a high current ion beam while avoiding the undesirable effects of beam blowup and the use of large, heavy magnetic elements. As a result, ion beam scanning of large area targets is performed with highly uniform dose distribution. The present invention has been described with reference to ion implantation. It will be understood by those skilled in the art that the invention described and claimed herein can be utilized in any application of scanned charged particle beams.

While there has been shown and described what is at present considered the preferred embodiments of the invention, it will be obvious to those skilled in the art that various changes and modifications may be made therein without departing from the scope of the invention as defined by the appended claims.

I claim:

1. Apparatus for charged particle beam treatment of a workpiece comprising:
    means for forming a charged particle beam of predetermined parameters;
    means for positioning the workpiece generally in the path of the charged particle beam;
    scanning means for deflecting the beam in at least one dimension over the surface of the workpiece; and
    space charge lens means interposed between said workpiece and said scanning means for steering the scanned beam into parallel paths, said spaced charge lens means including means for generating electrostatic and magnetic fields for confining an electron cloud having a generally uniform spatial distribution within a region traversed by the scanned beam.

2. Apparatus as defined in claim 1 wherein the scanning means includes a virtual center of deflection which is coincident with a focal point of said space charge lens means.

3. Apparatus as defined in claim 1 wherein the axis of the scanned beam passes through the focal point of said space charge lens means.

4. Apparatus as defined in claim 1 wherein said space charge lens means is axially symmetric.

5. Apparatus as defined in claim 2 wherein said scanning means is adapted for two dimensional scanning and includes a first set of deflection plates for beam deflection in one direction and two sets of deflection plates positioned on opposite sides of said first deflection plates axially upstream and downstream thereof, for beam deflection in a direction orthogonal to said one direction.

6. Apparatus as defined in claim 5 wherein said space charge lens means comprises a positively biased first cylindrical electrode, grounded cylindrical electrodes positioned near the ends of the first cylindrical electrode and axially aligned therewith, and current carrying coils for producing an axial magnetic field in the first cylindrical electrode.

7. Apparatus as defined in claim 1 wherein said means for forming a charged particle beam comprises means for forming a beam of ions and wherein said workpiece comprises a semiconductor wafer.

* * * * *